(12) United States Patent
Kim

(10) Patent No.: US 7,211,847 B2
(45) Date of Patent: May 1, 2007

(54) CMOS IMAGE SENSOR

(75) Inventor: Bum Sik Kim, Suwon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/318,503

(22) Filed: Dec. 28, 2005

(65) Prior Publication Data

US 2006/0138472 A1   Jun. 29, 2006

(30) Foreign Application Priority Data

Dec. 29, 2004   (KR) ............... 10-2004-0114841

(51) Int. Cl.
  *H01L 31/113* (2006.01)
  *H01L 21/00* (2006.01)
(52) U.S. Cl. .............. 257/291; 257/292; 257/E27.046; 257/E21.632; 438/60
(58) Field of Classification Search ............... 257/291, 257/292; 438/60
  See application file for complete search history.

(56) References Cited

U.S. PATENT DOCUMENTS

2006/0092300 A1 * 5/2006 Tan et al. .................. 348/308

FOREIGN PATENT DOCUMENTS

KR   2000-23088   4/2000

* cited by examiner

*Primary Examiner*—Evan Pert
(74) *Attorney, Agent, or Firm*—MeKenna Long & Aldridge LLP

(57) ABSTRACT

A CMOS image sensor includes a photo sensing device for generating photo charges, a floating diffusion region for storing the photo charges generated by the photo sensing device therein, a transfer transistor connected between the photo sensing device and the floating diffusion region for transferring the photo charges generated by the photo sensing device to the floating diffusion region, a reset transistor connected between a supply voltage terminal and the floating diffusion region for discharging the charges stored in the floating diffusion region to reset the floating diffusion region, a drive transistor for acting as a source follower buffer amplifier in response to an output signal from the photo sensing device, a switching transistor connected to the drive transistor for performing an addressing operation, and a charge control device connected between the photo sensing device and the transfer transistor for controlling the amount of charges stored in the photo sensing device.

10 Claims, 5 Drawing Sheets

CMOS IMAGE SENSOR

CROSS-REFERENCE TO RELATED APPLICATION

This application claims the benefit of Korean Patent Application No. P2004-114841, filed on Dec. 29, 2004, which is hereby incorporated by reference as if fully set forth herein.

BACKGROUND OF THE INVENTION

1. Field of the Invention

The present invention relates to a semiconductor device, and more particularly, to a CMOS image sensor wherein a charge control device is installed between a photo sensing device and a reset transistor to discharge excessive charges, thereby preventing interference with an adjacent transistor resulting from the excessive charges.

2. Discussion of the Related Art

Generally, image sensors are semiconductor devices which convert optical images into electrical signals, and may be roughly classified into a charge coupled device (CCD) image sensor or a complementary metal oxide silicon (CMOS) image sensor.

In the CCD image sensor, a driving system is complex, a large amount of power is consumed and a multistep photo process is required to result in a complex manufacturing process. Further, it is difficult to integrate a controller, a signal processor, an analog/digital (A/D) converter, etc. in one chip, which leads to difficulty in miniaturization of a product. Recently, the CMOS image sensor has been proposed to overcome the disadvantages of the CCD image sensor.

The CMOS image sensor is based on a CMOS technology which employs a controller, a signal processor, etc. as peripheral circuits. In the CMOS image sensor, MOS transistors corresponding to unit pixels are formed on a semiconductor substrate and a switching system is adopted to sequentially detect outputs of the respective unit pixels through the MOS transistors. In the CMOS image sensor, a small amount of power is consumed and a small number of photo process steps are performed, resulting in simplification in the manufacturing process. Furthermore, it is possible to integrate the controller, signal processor, A/D converter, etc. in a CMOS image sensor chip, thereby facilitating miniaturization of a product.

However, in such a conventional CMOS image sensor, when the amount of incident light is too large, excessive charges may be stored in a photo sensing device that acts to convert an optical signal into an electrical signal. In this case, the charges stored in the photo sensing device may overflow to an adjacent electrical contact point, resulting in signal distortion.

This problem with the conventional CMOS image sensor will hereinafter be described in detail with reference to FIGS. 1 and 2.

FIG. 1 is a circuit diagram of a unit pixel of the conventional CMOS image sensor having four transistors. As shown in this drawing, the CMOS image sensor comprises a photo sensing device, for example, a photodiode 100 for generating photo charges; a transfer transistor 101 for receiving a Tx signal at its gate and transferring the photo charges generated by the photo sensing device 100 to a floating diffusion region FD 102 in response to the received Tx signal; a reset transistor 103 for receiving an Rs signal at its gate, and in response to the received Rs signal, setting the potential of the floating diffusion region FD 102 to a desired value and discharging charges stored in the floating diffusion region FD 102 to reset the floating diffusion region FD 102; a drive transistor 104 for acting as a source follower buffer amplifier in response to a signal input to its gate; and a select transistor 105 for performing an addressing operation in response to a signal inputted to its gate.

FIG. 2 shows an overflow phenomenon which occurs in the CMOS image sensor of FIG. 1.

When strong light is incident on the photo sensing device 100 formed in a P-well 111 on a P-type semiconductor substrate 110, the generation of a large number of charges resulting from the incident light occurs very rapidly. For this reason, the charges that should only be gathered in the photo sensing device 100 may be passed through a region beneath an STI 112 and then transferred to an adjacent transistor or photo sensing device, thereby causing signal distortion.

SUMMARY OF THE INVENTION

Accordingly, the present invention is directed to a CMOS image sensor that substantially obviates one or more problems due to limitations and disadvantages of the related art.

The present invention provides a CMOS image sensor wherein a charge control device is installed between a photo sensing device and a reset transistor to discharge excessive charges, thereby preventing interference with an adjacent transistor resulting from excessive charges.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the invention, as embodied and broadly described herein, a CMOS image sensor comprises: a photo sensing device for generating photo charges; a floating diffusion region for storing the photo charges generated by the photo sensing device; a transfer transistor connected between the photo sensing device and the floating diffusion region for transferring the photo charges generated by the photo sensing device to the floating diffusion region; a reset transistor connected between a supply voltage terminal and the floating diffusion region for discharging the charges stored in the floating diffusion region to reset the floating diffusion region; a drive transistor for acting as a source follower buffer amplifier in response to an output signal from the photo sensing device; a switching transistor connected to the drive transistor for performing an addressing operation; and a charge control device connected between the photo sensing device and the transfer transistor for controlling the amount of charges stored in the photo sensing device.

The charge control device can be implemented with a transistor.

The charge control device may control the amount of the charges stored in the photo sensing device by discharging excessive charges stored in the photo sensing device. To this end, a potential barrier between the charge control device and the photo sensing device may be formed to a height smaller than that of a potential barrier between the photo sensing device and the transfer transistor so that the excessive charges stored in the photo sensing device can flow to the charge control device so as to be discharged.

The charge control device can have one terminal connected to one terminal of the transfer transistor and one terminal of the photo sensing device, and the other terminal connected to the supply voltage terminal, to which one terminal of the reset transistor and one terminal of the drive transistor are connected.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
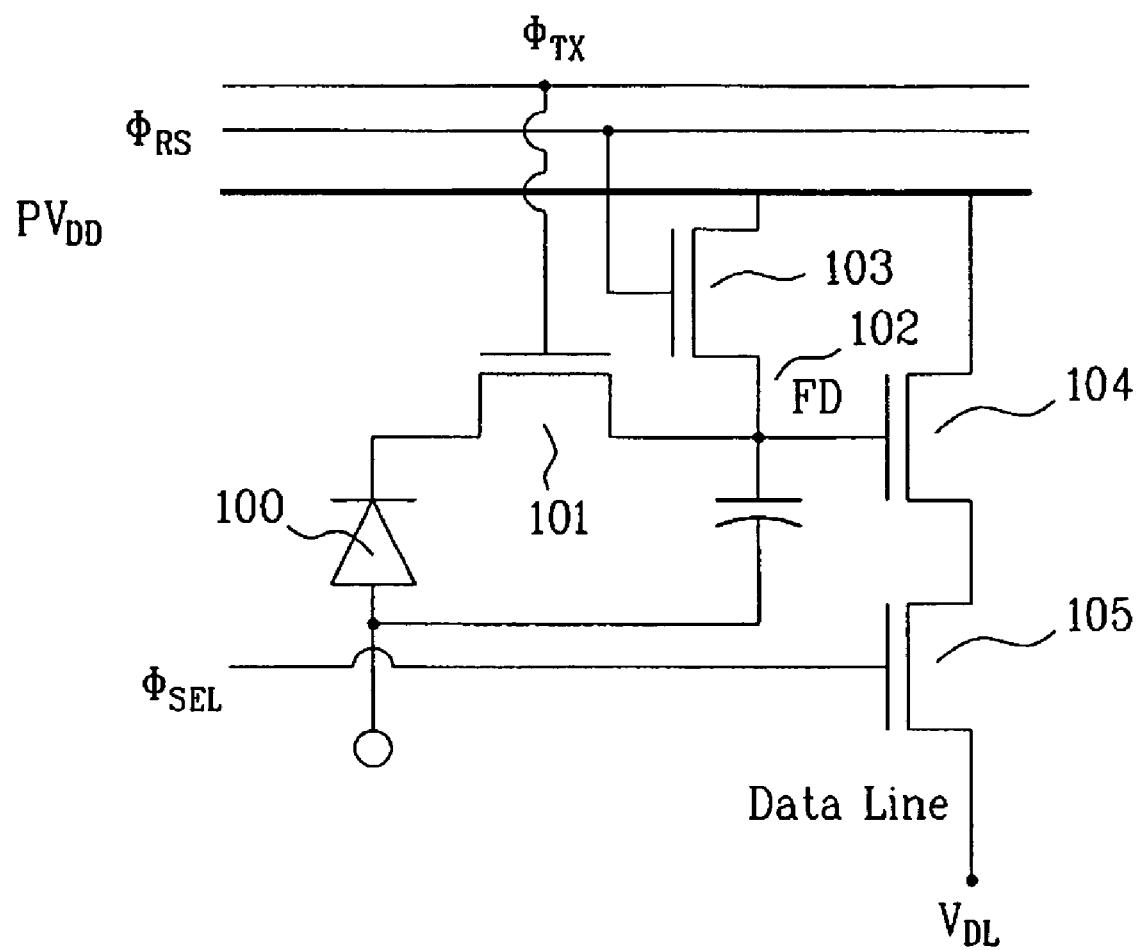
FIG. 1 is a circuit diagram of a unit pixel of a conventional CMOS image sensor having four transistors.
Figure 2:
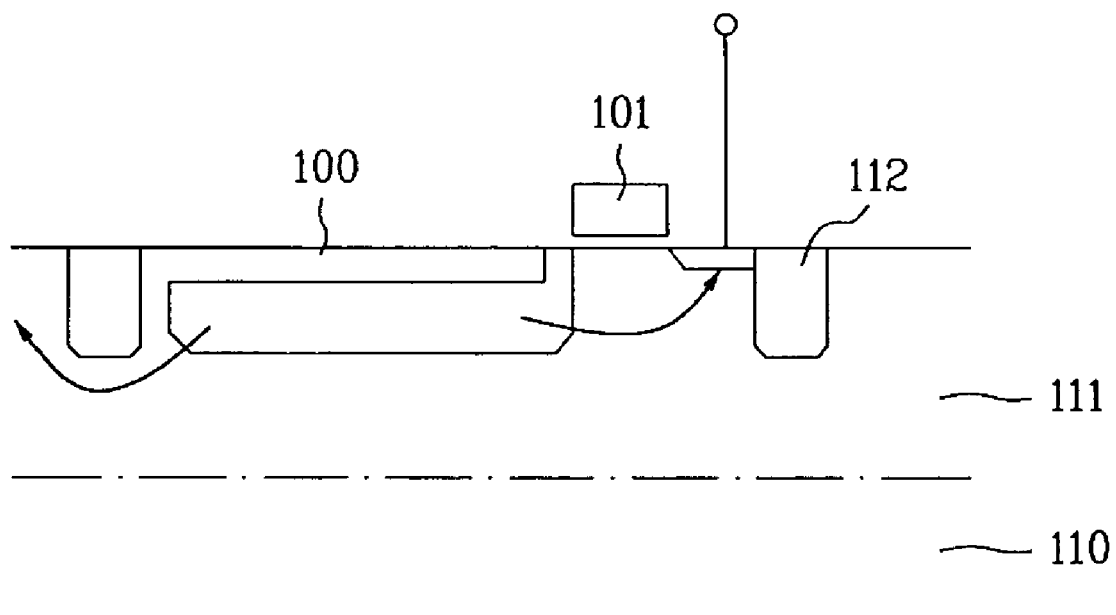
FIG. 2 is a view showing an overflow phenomenon of the conventional CMOS image sensor of FIG. 1.
Figure 3:
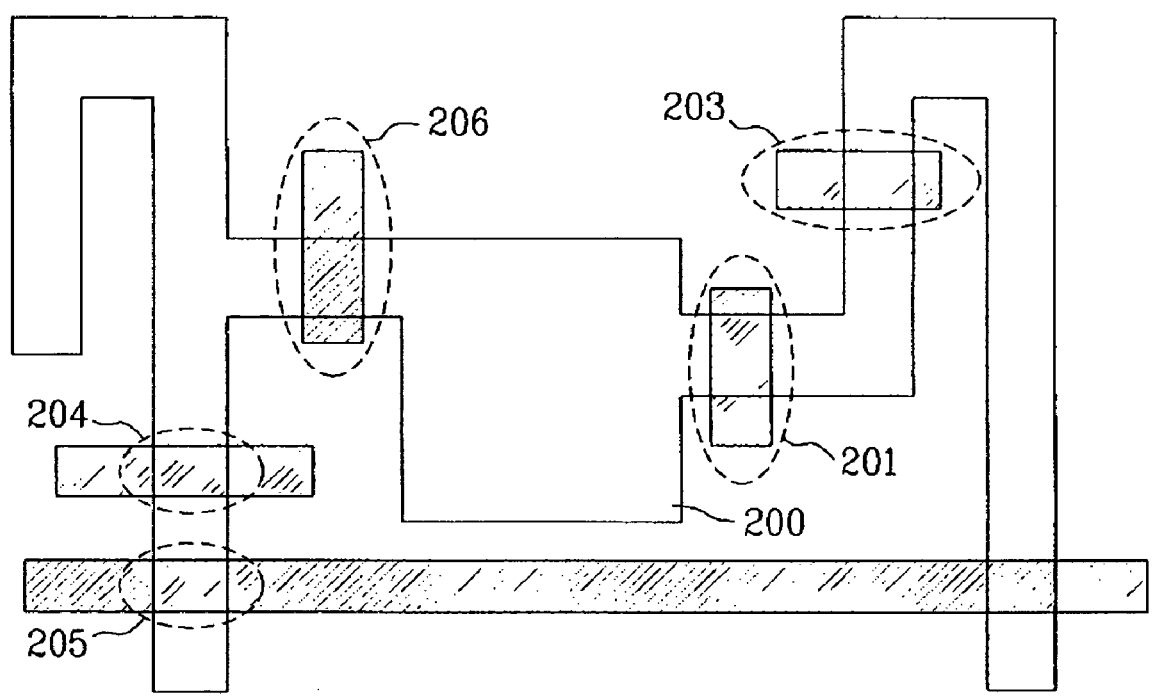
FIG. 3 is a view showing a layout of a unit pixel of a CMOS image sensor according to an exemplary embodiment of the present invention.

FIG. 3 shows a layout of a unit pixel of a CMOS image sensor according to an exemplary embodiment of the present invention.

As shown in FIG. 3, the CMOS image sensor according to the present invention comprises a photo sensing device, for example, a photodiode, 200 for generating photo charges, a transfer transistor 201 for receiving a Tx signal at its gate and transferring the photo charges generated by the photo sensing device 200 to a floating diffusion region FD (not shown) in response to the received Tx signal, a reset transistor 203 for receiving an Rs signal at its gate and, in response to the received Rs signal, setting the potential of the floating diffusion region FD to a desired value and discharging charges stored in the floating diffusion region FD to reset the floating diffusion region FD, a drive transistor 204 for acting as a source follower buffer amplifier in response to a signal input to its gate, a select transistor 205 for performing an addressing operation in response to a signal inputted to its gate, and a charge control device 206 for discharging excessive charges generated by the photo sensing device 200. The charge control device 206 can be implemented with a transistor, as in the description below.

Figure 4:
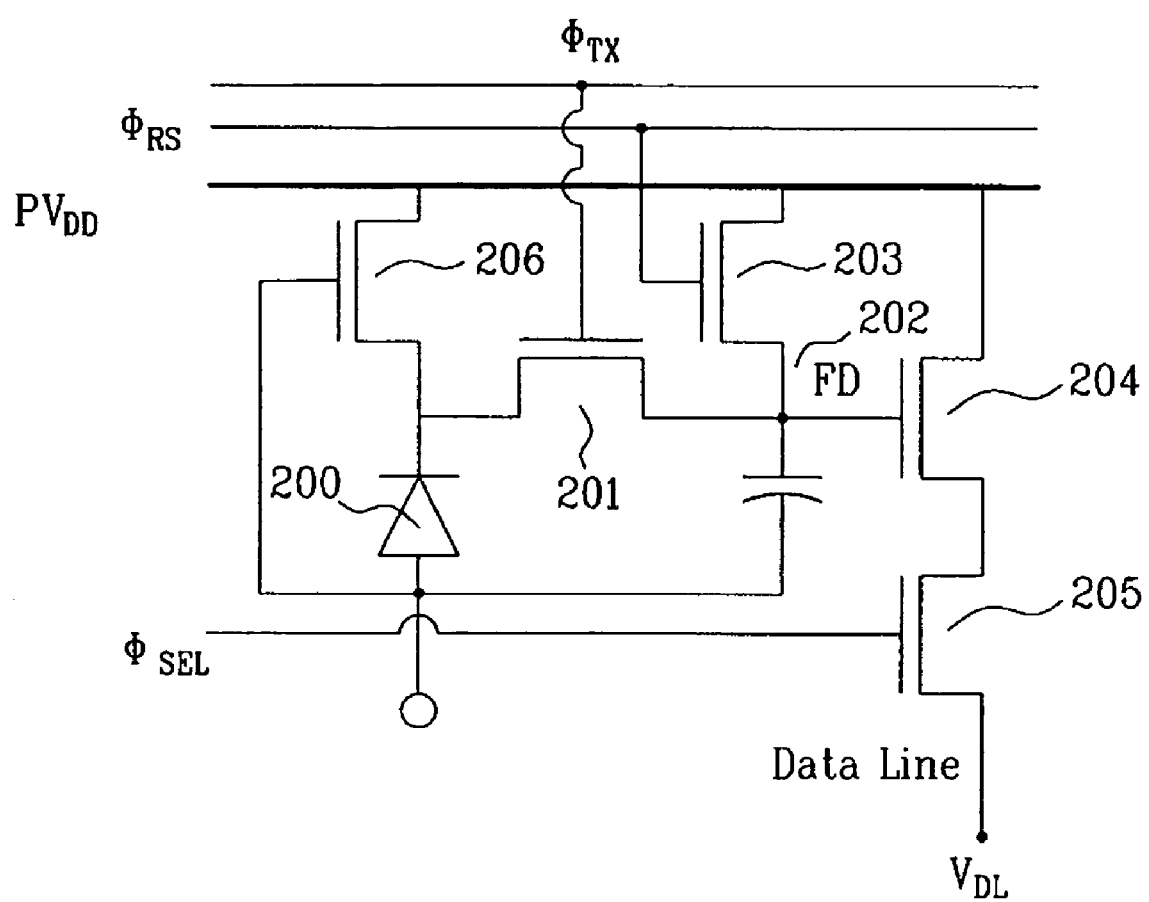
FIG. 4 is an equivalent circuit diagram of the unit pixel of the CMOS image sensor of FIG. 3.

FIG. 4 is an equivalent circuit diagram of the unit pixel of the CMOS image sensor of FIG. 3.

As shown in FIG. 4, the transfer transistor 201 is connected between the photo sensing device 200 and the floating diffusion region FD 202. The reset transistor 203 has one terminal connected to a supply voltage terminal $PV_{DD}$ and the other terminal connected to the floating diffusion region FD 202. The drive transistor 204 has one terminal connected to the supply voltage terminal $PV_{DD}$ and the other terminal connected to one terminal of the select transistor 205. The charge control transistor 206 has one terminal connected to the supply voltage terminal $PV_{DD}$ and the other terminal connected to one terminal of the photo sensing device 200 and one terminal of the transfer transistor 201. The charge control transistor 206 acts to discharge excessive charges generated by the photo sensing device 200 in response to a signal input to its gate.

Figure 5:
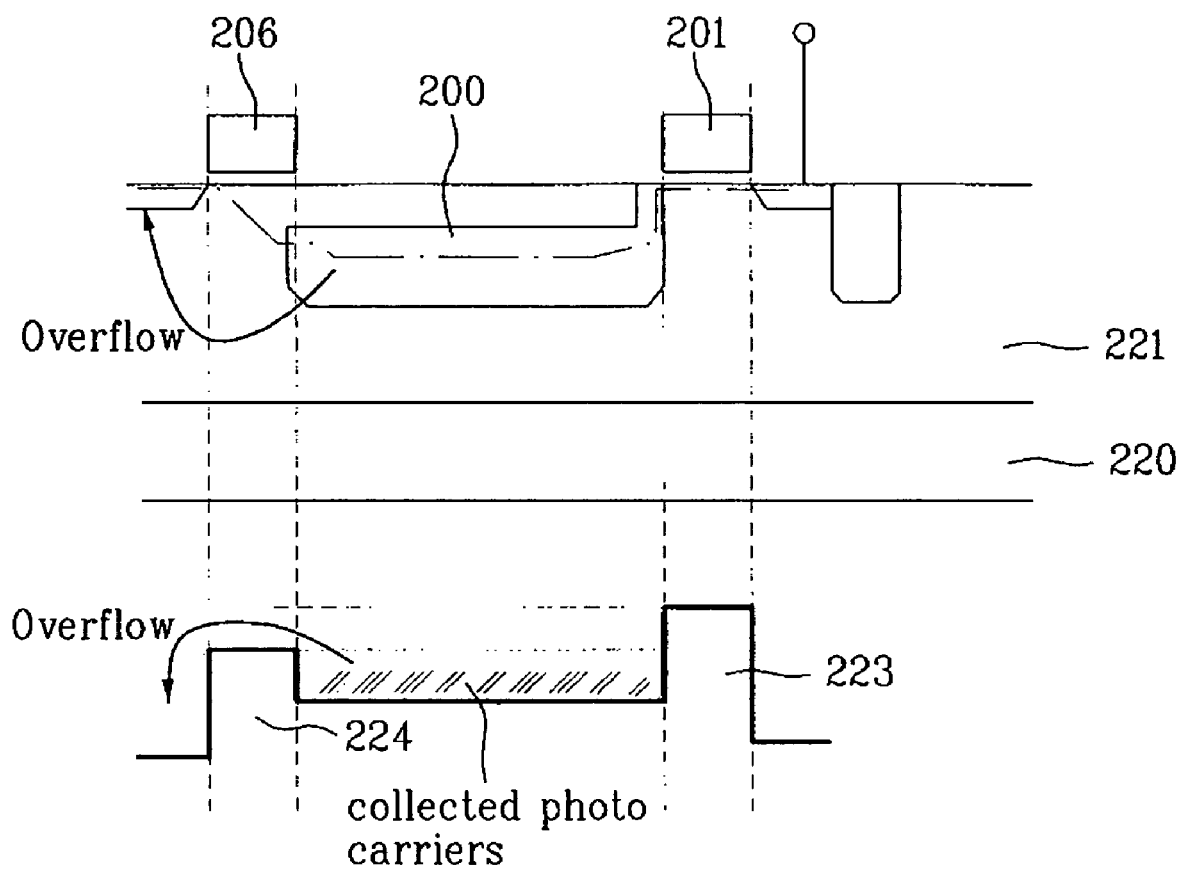
FIG. 5 is a view showing a potential profile of the unit pixel of the CMOS image sensor of FIG. 3.

FIG. 5 shows a potential profile of the unit pixel of the CMOS image sensor of FIG. 3.

As shown in FIG. 5, the photo sensing device 200, transfer transistor 201 and charge control transistor 206 are formed on a semiconductor substrate 220 with a P-well 221, and a first potential barrier 223 between the photo sensing device 200 and the transfer transistor 201 is formed to a height greater than that of a second potential barrier 224 between the photo sensing device 200 and the charge control transistor 206. As a result, excessive charges stored in the photo sensing device 200 flow to the charge control transistor 206.

As apparent from the above description, the present invention provides a CMOS image sensor wherein a charge control device is installed between a photo sensing device and a reset transistor to discharge excessive charges, thereby removing noise resulting from the drift of the excessive charges to an adjacent electrical contact point.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A complementary metal oxide silicon (CMOS) image sensor comprising:
    a photo sensing device for generating photo charges;
    a floating diffusion region for storing the photo charges generated by the photo sensing device;
    a transfer transistor connected between the photo sensing device and the floating diffusion region for transferring the photo charges generated by the photo sensing device to the floating diffusion region;
    a reset transistor connected between a supply voltage terminal and the floating diffusion region for discharging the charges stored in the floating diffusion region to reset the floating diffusion region;
    a drive transistor for acting as a source follower buffer amplifier in response to an output signal from the photo sensing device;
    a switching transistor connected to the drive transistor for performing an addressing operation; and
    a charge control device connected between the photo sensing device and the transfer transistor for controlling the amount of charges stored in the photo sensing device.

2. The CMOS image sensor as set forth in claim 1, wherein the charge control device is implemented with a transistor.

3. The CMOS image sensor as set forth in claim 1, wherein the charge control device controls the amount of the charges stored in the photo sensing device by discharging excessive charges stored in the photo sensing device.

4. The CMOS image sensor as set forth in claim 3, wherein a potential barrier between the charge control device and the photo sensing device is formed to a height smaller than that of a potential barrier between the photo sensing device and the transfer transistor so that the excessive charges stored in the photo sensing device can flow to the charge control device to be discharged.

5. The CMOS image sensor as set forth in claim 1, wherein the charge control device has one terminal connected to one terminal of the transfer transistor and one terminal of the photo sensing device, and the other terminal connected to the supply voltage terminal to which one terminal of the reset transistor and one terminal of the drive transistor are connected.

6. A method of manufacturing a complementary metal oxide silicon (CMOS) image sensor, the method comprising comprising:

providing a photo sensing device for generating photo charges;

providing a floating diffusion region for storing the photo charges generated by the photo sensing device;

connecting a transfer transistor between the photo sensing device and the floating diffusion region for transferring the photo charges generated by the photo sensing device to the floating diffusion region;

connecting a reset transistor between a supply voltage terminal and the floating diffusion region for discharging the charges stored in the floating diffusion region to reset the floating diffusion region;

providing a drive transistor for acting as a source follower buffer amplifier in response to an output signal from the photo sensing device;

connecting a switching transistor to the drive transistor for performing an addressing operation; and connecting a charge control device between the photo sensing device and the transfer transistor for controlling the amount of charges stored in the photo sensing device.

7. The method as set forth in claim 6, wherein the charge control device is implemented with a transistor.

8. The method as set forth in claim 6, wherein the charge control device controls the amount of the charges stored in the photo sensing device by discharging excessive charges stored in the photo sensing device.

9. The method as set forth in claim 8, wherein a potential barrier between the charge control device and the photo sensing device is formed to a height smaller than that of a potential barrier between the photo sensing device and the transfer transistor so that the excessive charges stored in the photo sensing device can flow to the charge control device to be discharged.

10. The method as set forth in claim 6, wherein the charge control device has one terminal connected to one terminal of the transfer transistor and one terminal of the photo sensing device, and the other terminal connected to the supply voltage terminal to which one terminal of the reset transistor and one terminal of the drive transistor are connected.

* * * * *